United States Patent
Tsuda

(10) Patent No.: US 9,644,282 B2
(45) Date of Patent: May 9, 2017

(54) MANUFACTURING METHOD OF ELECTRONIC COMPONENT

(71) Applicant: Murata Manufacturing Co., Ltd., Nagaokakyo-shi, Kyoto-fu (JP)

(72) Inventor: Motoji Tsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 129 days.

(21) Appl. No.: 14/339,478

(22) Filed: Jul. 24, 2014

(65) Prior Publication Data

US 2014/0332395 A1    Nov. 13, 2014

Related U.S. Application Data

(63) Continuation of application No. PCT/JP2013/050171, filed on Jan. 9, 2013.

(30) Foreign Application Priority Data

Jan. 30, 2012   (JP) .................................. 2012-016808

(51) Int. Cl.
| | | |
|---|---|---|
| *C25D 5/02* | (2006.01) | |
| *H03H 3/08* | (2006.01) | |
| *H03H 9/10* | (2006.01) | |

(52) U.S. Cl.
CPC ................. *C25D 5/02* (2013.01); *H03H 3/08* (2013.01); *H03H 9/1071* (2013.01)

(58) Field of Classification Search
CPC ........... C25D 5/02; H01L 41/18; H03H 9/145
USPC .......................................... 310/313; 205/114
See application file for complete search history.

(56) References Cited

U.S. PATENT DOCUMENTS

| | | | | |
|---|---|---|---|---|
| 3,859,180 A | * | 1/1975 | Hasty ..................... | H01L 21/00 205/114 |
| 3,959,874 A | * | 6/1976 | Coucoulas .......... | H01L 23/3121 174/528 |
| 3,960,674 A | * | 6/1976 | Coucoulas ............. | H05K 3/188 205/114 |
| 4,915,795 A | * | 4/1990 | McKiel, Jr. ............ | H05K 3/423 174/266 |

(Continued)

FOREIGN PATENT DOCUMENTS

| | | |
|---|---|---|
| EP | 2 352 226 A1 | 8/2011 |
| JP | 2007-28195 A | 2/2007 |

(Continued)

OTHER PUBLICATIONS

Official Communication issued in corresponding International Application PCT/JP2013/050171, mailed on Mar. 26, 2013.

*Primary Examiner* — Harry D Wilkins, III
(74) *Attorney, Agent, or Firm* — Keating & Bennett, LLP

(57) ABSTRACT

A manufacturing method of an electronic component allows an intermediate inspection during a manufacturing process and includes forming element electrodes and feed lines such that pad portions of the element electrodes and the corresponding one of the feed lines faces each other via a gap in a plan view, and such that the feed lines are located below the pad portions 11*b*. Electrolytic plating is performed while power is supplied to the feed lines to form a plating film that electrically connects the feed lines and the pad portions. The mother substrate is singulated to obtain an electronic component.

16 Claims, 10 Drawing Sheets

(56) References Cited

U.S. PATENT DOCUMENTS

| | | | | |
|---|---|---|---|---|
| 4,994,154 A | * | 2/1991 | Chen | C23C 18/31 205/103 |
| 5,645,707 A | * | 7/1997 | Omoto | C25D 7/12 205/114 |
| 7,918,982 B2 | * | 4/2011 | Hasegawa | B82Y 10/00 205/114 |
| 2006/0043992 A1 | * | 3/2006 | Jimi | 324/758 |
| 2007/0205855 A1 | * | 9/2007 | Hashimoto | H01F 5/003 336/200 |
| 2008/0122318 A1 | | 5/2008 | Aikawa et al. | |
| 2009/0212399 A1 | | 8/2009 | Kaneda et al. | |
| 2011/0176264 A1 | * | 7/2011 | Tsuda | 361/679.01 |

FOREIGN PATENT DOCUMENTS

| | | |
|---|---|---|
| JP | 2008-135999 A | 6/2008 |
| JP | 2009-206183 A | 9/2009 |
| JP | 2010-103811 A | 5/2010 |
| JP | 2011-229043 A | 11/2011 |
| WO | 2010/047031 A1 | 4/2010 |

* cited by examiner

MANUFACTURING METHOD OF ELECTRONIC COMPONENT

BACKGROUND OF THE INVENTION

1. Field of the Invention

The present invention relates to a manufacturing method of an electronic component.

2. Description of the Related Art

A variety of electronic components having electrodes provided on a substrate have been known. Specific examples of the electronic components include, for example, an elastic wave device including interdigital transducer electrodes provided on a piezoelectric substrate.

To manufacture an elastic wave device, electrodes for a plurality of elastic wave devices are formed on a piezoelectric mother substrate, as described in Japanese Unexamined Patent Application Publication No. 2008-135999, for example. Thereafter, the mother substrate is divided to be singulated into a plurality of elastic wave devices. On the mother substrate, feed lines are connected to the respective electrodes.

In the manufacturing method of an elastic wave device described in Japanese Unexamined Patent Application Publication No. 2008-135999, all terminal electrodes are connected by the feed lines on the mother substrate. It is therefore difficult to individually inspect the electrodes provided on the mother substrate.

SUMMARY OF THE INVENTION

Preferred embodiments of the present invention provide a manufacturing method of an electronic component allowing an intermediate inspection during a manufacturing process.

A manufacturing method of an electronic component according to a preferred embodiment of the present invention relates to a manufacturing method of an electronic component that includes a substrate and an element electrode provided on the substrate, in which the element electrode includes functional electrode portions and pad portions connected to the functional electrode portions. The manufacturing method of an electronic component according to a preferred embodiment of the present invention includes an electrode forming process, a plating process, and a singulation process. The electrode forming process is a process of forming a plurality of element electrodes and feed lines on a mother substrate for forming the substrate such that each of the pad portions of the plurality of element electrodes and the corresponding one of the feed lines face each other via a gap in a plan view, and that the feed lines are located below the pad portions. The plating process is a process of performing electrolytic plating while supplying power to the feed lines, to form a plating film that electrically connects the feed lines and the pad portions. The singulation process is a process of singulating the mother substrate to obtain the electronic component.

In a specific aspect of the manufacturing method of an electronic component according to a preferred embodiment of the present invention, the manufacturing method of an electronic component further includes an inspection process. The inspection process is a process of inspecting the functional electrode portions by bringing a probe into contact with the pad portions prior to the plating process.

In another specific aspect of the manufacturing method of an electronic component according to a preferred embodiment of the present invention, the manufacturing method of an electronic component further includes a process of forming an insulating layer on the mother substrate. In the electrode forming process, at least portions of the pad portions are formed on the insulating layer.

In another specific aspect of the manufacturing method of an electronic component according to a preferred embodiment of the present invention, the manufacturing method of an electronic component further includes a process of forming concave portions in the mother substrate. In the electrode forming process, portions of the feed lines facing the pad portions are formed on the concave portions.

In another specific aspect of the manufacturing method of an electronic component according to a preferred embodiment of the present invention, the element electrodes and the feed lines are formed by the same process in the electrode forming process.

In another specific aspect of the manufacturing method of an electronic component according to a preferred embodiment of the present invention, the feed lines are formed after the formation of at least the functional electrode portions of the element electrodes in the electrode forming process.

In another specific aspect of the manufacturing method of an electronic component according to a preferred embodiment of the present invention, the substrate is a piezoelectric substrate, the functional electrode portions include interdigital transducer electrodes, and the electronic component is an elastic wave component.

In another specific aspect of the manufacturing method of an electronic component according to a preferred embodiment of the present invention, at least portions of the feed lines are removed in the singulation process to prevent the pad portions from being electrically connected by the feed lines.

According to various preferred embodiments of the present invention, it is possible to provide a manufacturing method of an electronic component allowing an intermediate inspection during a manufacturing process.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
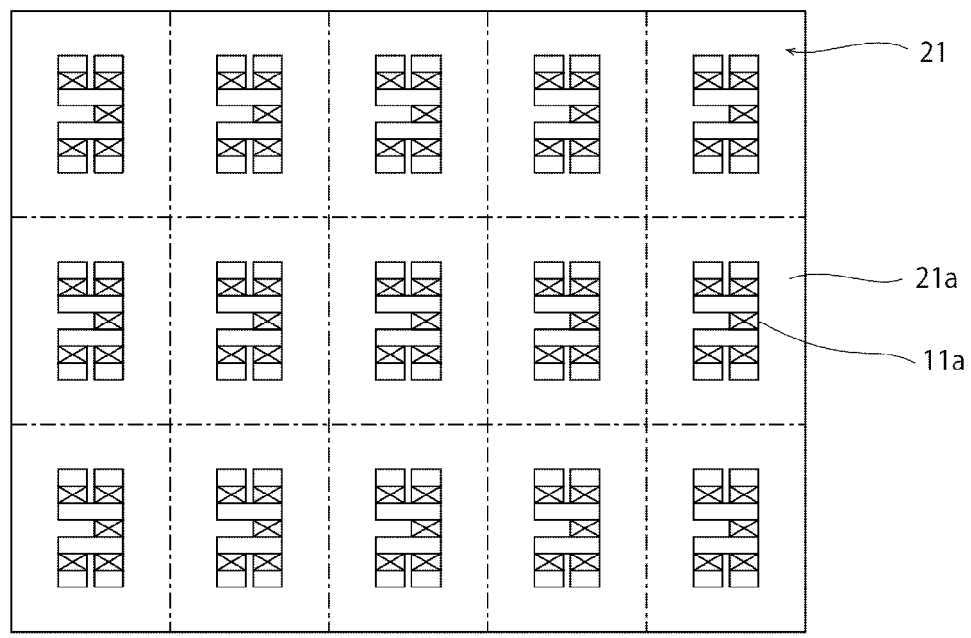
FIG. 1 is a schematic plan view for describing a manufacturing method of an electronic component in a first preferred embodiment of the present invention.

An example of a preferred embodiments of the present invention will be described below. However, the following preferred embodiments are merely illustrative examples. The present invention is not limited at all to the following preferred embodiments.

Further, in the drawings to be referred to in the description of preferred embodiments and so forth, members practically the same in function will be designated by identical reference signs. Further, the drawings to be referred to in the description of preferred embodiments and so forth are schematically drawn, and the dimensional ratio or the like of an object drawn in the drawings may be different from the dimensional ratio or the like of an actual object. The dimensional ratio or the like of an object may also be different between the drawings. A specific dimensional ratio or the like of an object should be judged in consideration of the following description.

First Preferred Embodiment

Figure 14:
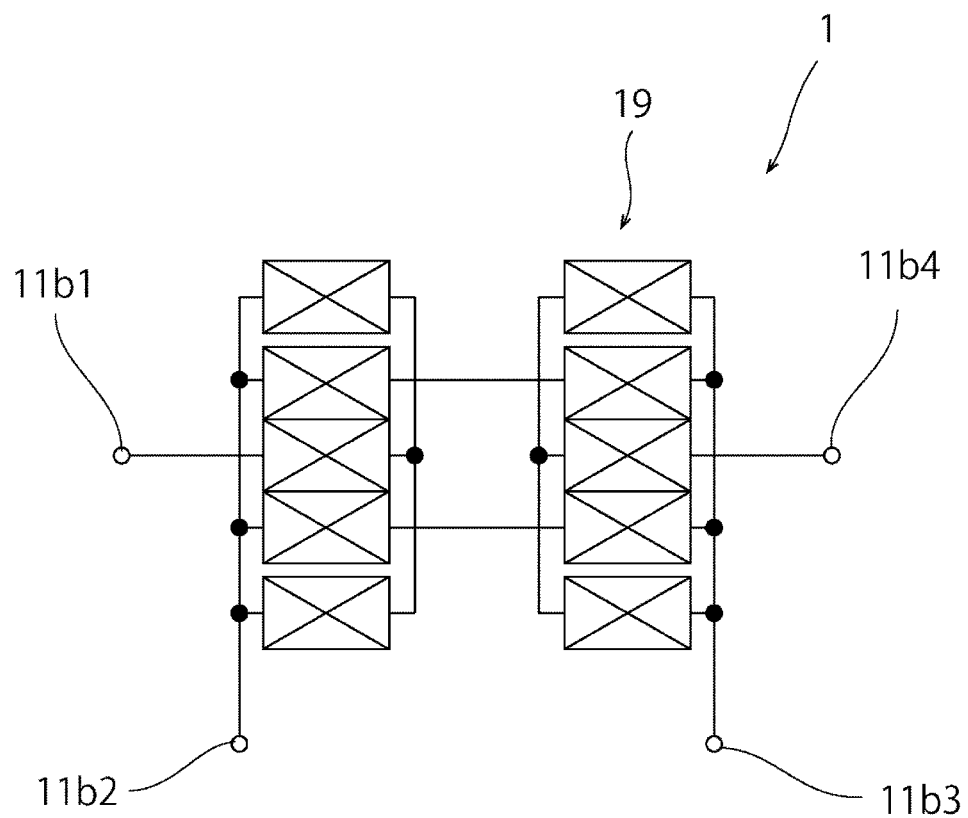
FIG. 14 is a schematic circuit diagram of an electronic component according to a second example of a preferred embodiment of the present invention.
Figure 15:
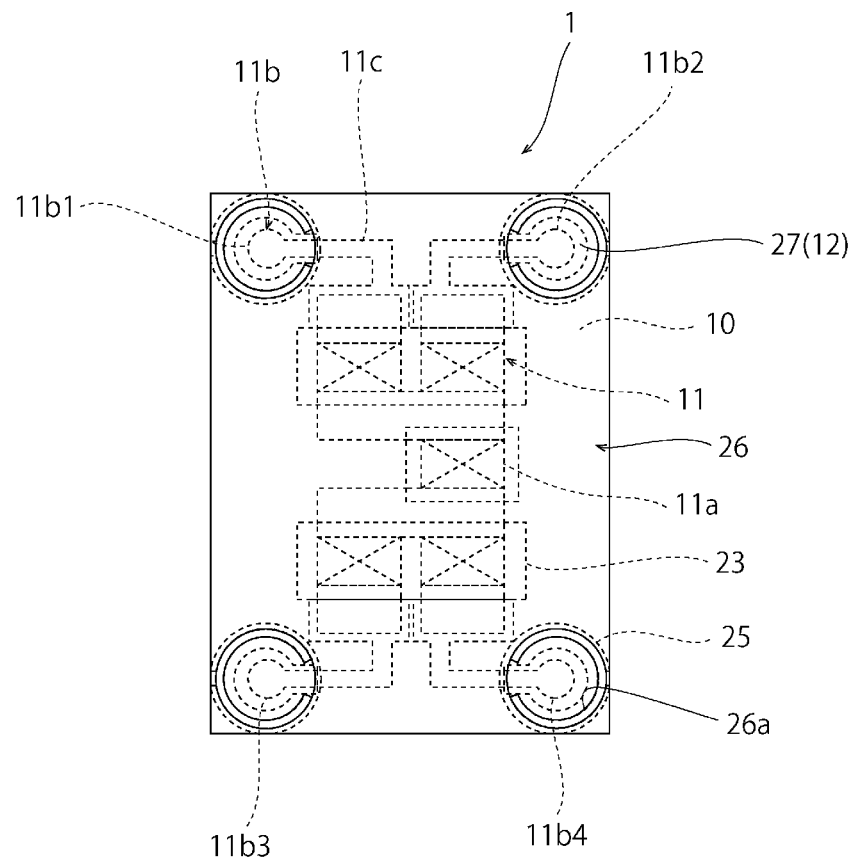
FIG. 15 is a schematic plan view of an electronic component manufactured in the first preferred embodiment of the present invention.

In the present preferred embodiment, an example of a manufacturing method of an electronic component 1 illustrated in FIG. 15 will be described with reference to FIGS. 1 to 14. In FIGS. 2, 4, 6, 8, and 10, only one of later-described regions 21a of a mother substrate 21 is illustrated.

The electronic component 1 includes a substrate 10 and an element electrode 11. The element electrode 11 is provided on the substrate 10. The element electrode 11 includes functional electrode portions 11a and pad portions 11b connected to the functional electrode portions 11a. An under-bump metal is provided on each of the pad portions 11b.

For example, the electronic component 1 may be an elastic wave component, such as a surface acoustic wave component, a bulk elastic wave component, or a boundary acoustic wave component, in which the substrate 10 is formed by a piezoelectric substrate, and the functional electrode portions 11a include interdigital transducer electrodes.

Figure 13:
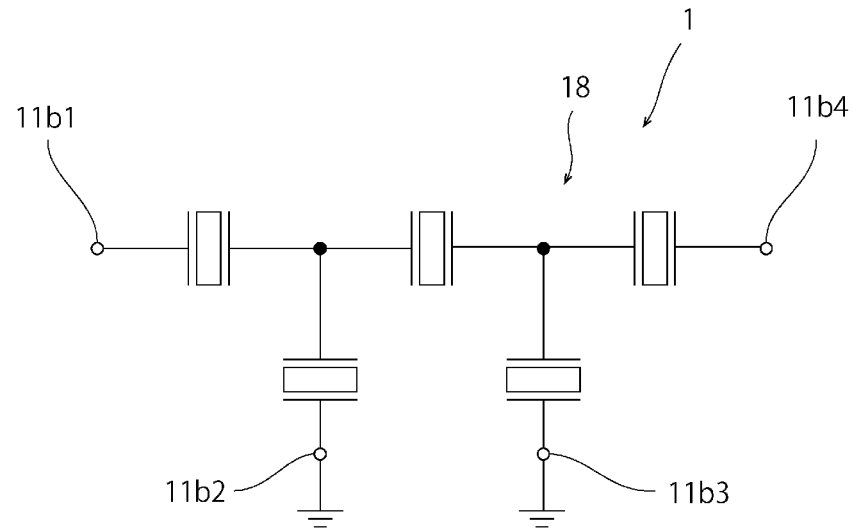
FIG. 13 is a schematic circuit diagram of an electronic component according to a first example of a preferred embodiment of the present invention.

For example, as illustrated in FIG. 13, the electronic component 1 may be an elastic wave filter component including a ladder elastic wave filter unit 18. Further, as illustrated in FIG. 14, the electronic component 1 may be an elastic wave filter component including a longitudinally coupled resonator-type elastic wave filter unit 19.

A mother substrate 21 illustrated in FIG. 1 is first prepared. The mother substrate 21 is a substrate for forming a plurality of substrates 10. That is, the mother substrate 21 includes a plurality of regions 21a for forming the substrates 10. In FIG. 1, boundaries between the regions 21a are indicated by dash-dotted lines.

If the substrates 10 are piezoelectric substrates, for example, the mother substrate 21 may be formed by a piezoelectric substrate made of $LiNbO_3$, $LiTaO_3$, or the like.

Figure 2:
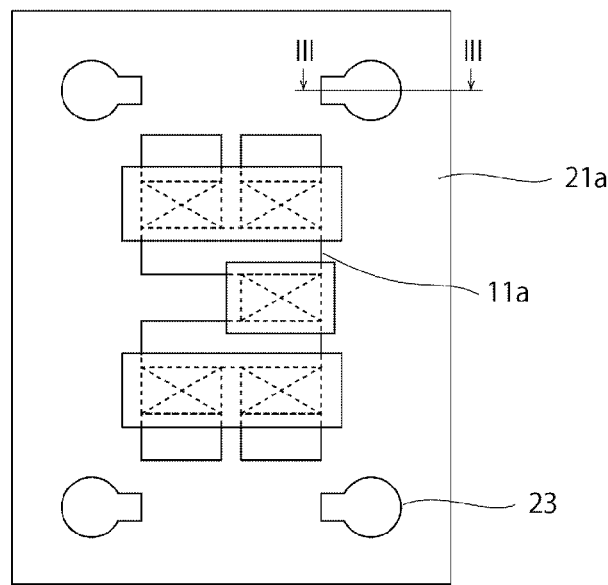
FIG. 2 is a schematic plan view for describing the manufacturing method of an electronic component in the first preferred embodiment of the present invention.
Figure 3:
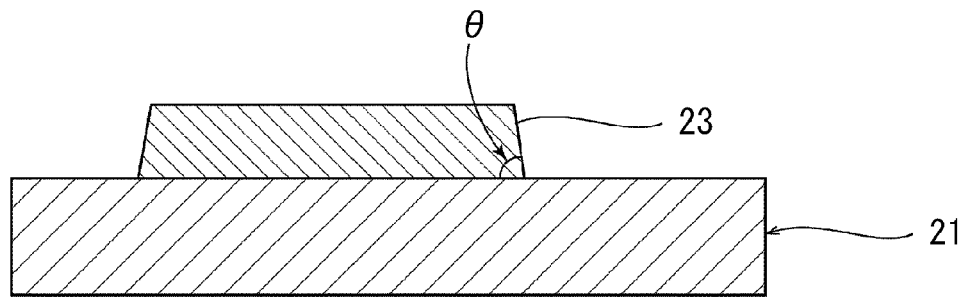
FIG. 3 is a schematic cross-sectional view along a line III-III of FIG. 2.

Then, an electrode forming process is performed. In the electrode forming process, a plurality of element electrodes and feed lines 22 (see FIG. 4) are formed on the mother substrate 21. In the present preferred embodiment, a plurality of element electrodes 11 each including functional electrode portions 11a and a plurality of pad portions 11b are first formed, as illustrated in FIGS. 1 to 3. Thereafter, the feed lines 22 are formed, as illustrated in FIG. 4.

The method of forming the plurality of element electrodes 11 is not particularly limited. For example, it is possible to form the plurality of element electrodes 11 by forming at least one conductive layer and thereafter patterning the conductive layer. Methods of forming the conductive layer include, for example, a sputtering method and a CVD (chemical vapor deposition) method. Methods of patterning the conductive layer include, for example, a photolithographic method.

More specifically, the functional electrode portions 11a are first formed, as illustrated in FIG. 1. Then, as illustrated in FIGS. 2 and 3, an insulating layer 23 is formed on portions of the mother substrate 21, on which the pad portions 11b are to be formed. It is preferable that the insulating layer 23 is thicker than the feed lines 22 to reliably insulate the pad portions 11b and the feed lines 22 from each other. It is preferable that the thickness of the insulating layer 23 is greater than that of the feed lines 22 by about 1.5 times or more, for example. The material forming the insulating layer 23 is not particularly limited. The insulating layer 23 may be made of silicon oxide, silicon nitride, polyimide, or epoxy, for example. Further, it is preferable that an angle θ (see FIG. 3) defined by a side surface of the insulating layer 23 and the mother substrate 21 is θ≤90°, for example.

Figure 4:
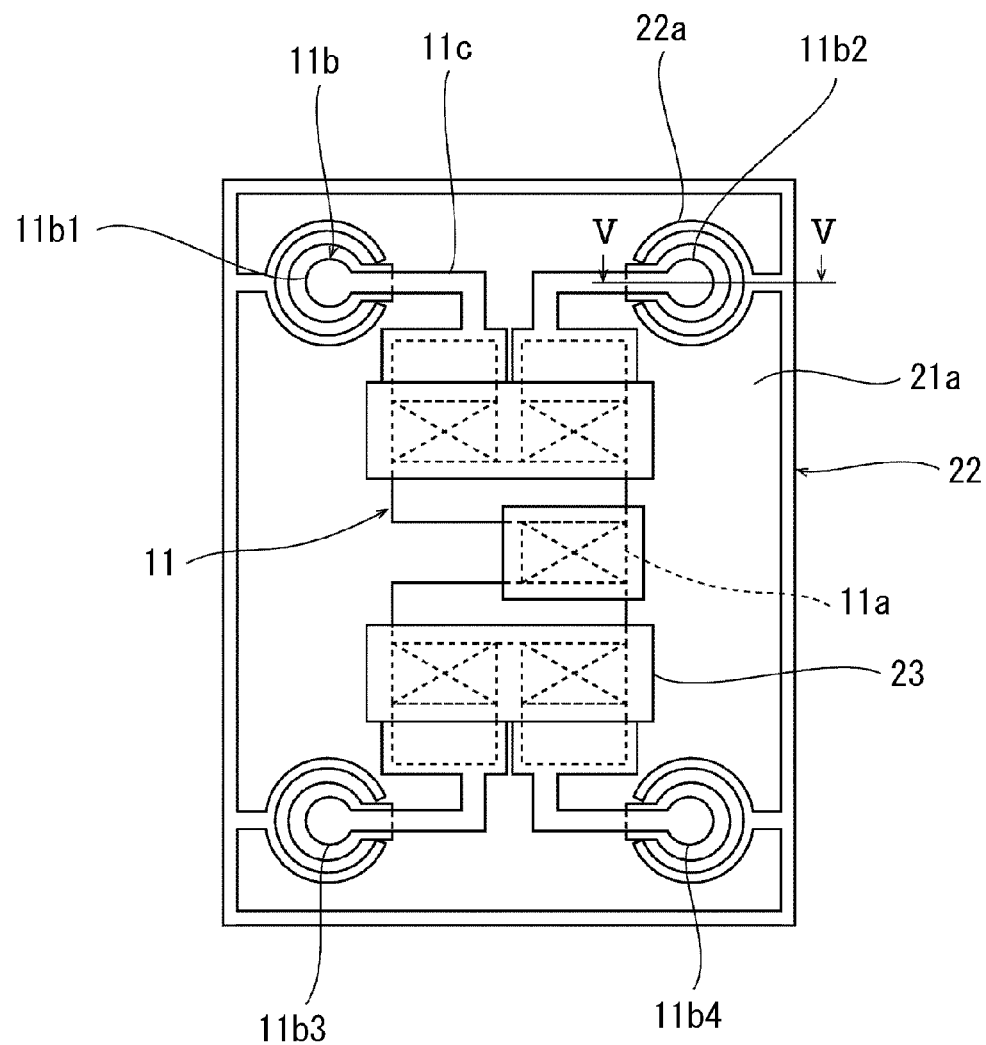
FIG. 4 is a schematic plan view for describing the manufacturing method of an electronic component in the first preferred embodiment of the present invention.
Figure 5:
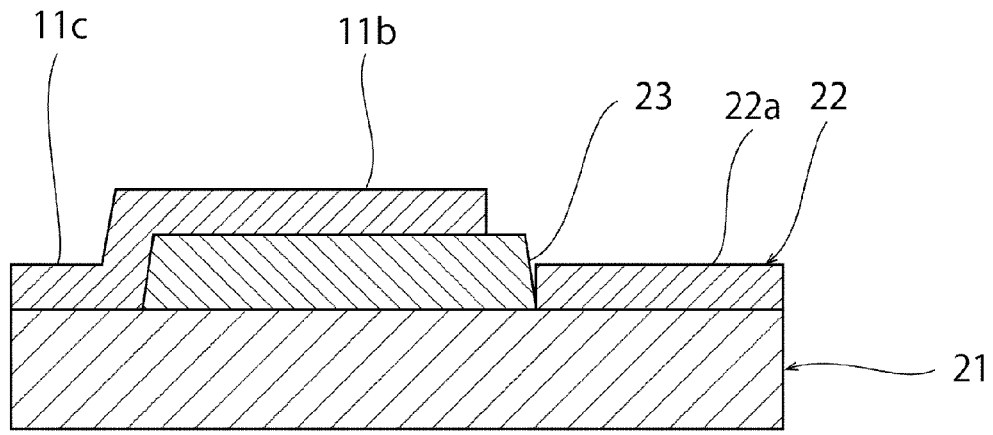
FIG. 5 is a schematic cross-sectional view along a line V-V of FIG. 4.

Then, as illustrated in FIGS. 4 and 5, the pad portions 11b and wiring lines 11c to connect the pad portions 11b and the functional electrode portions 11a are formed such that at least portions of the pad portions 11b are located on the insulating layer 23. The pad portions 11b include first, second, third and fourth pad portions 11b1 to 11b4.

Figure 6:
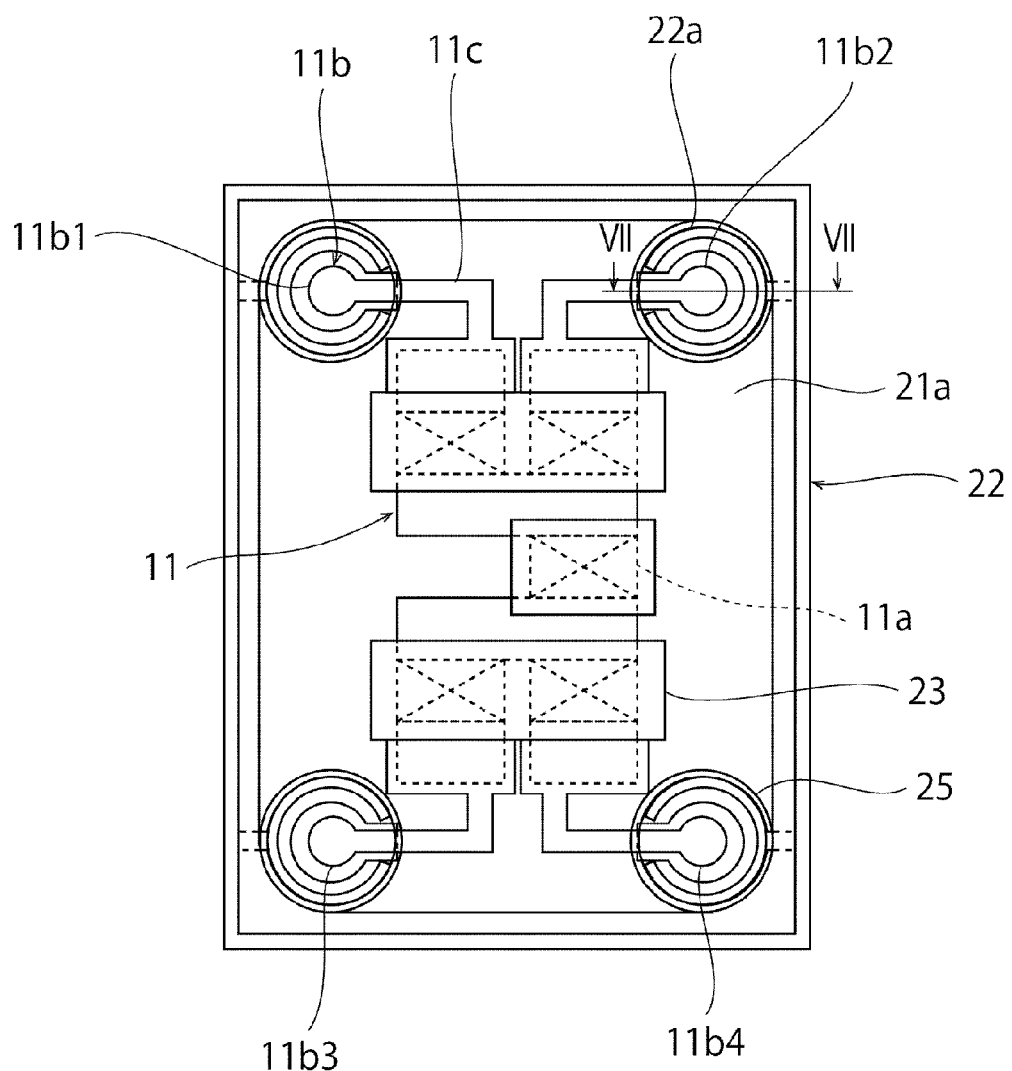
FIG. 6 is a schematic plan view for describing the manufacturing method of an electronic component in the first preferred embodiment of the present invention.

Further, in the present preferred embodiment, the feed lines 22 are preferably formed by the same process as that for the pad portions 11b and the wiring lines 11c. Specifically, as illustrated in FIG. 6, the pad portions 11b1 to 11b4 and the feed lines 22 are formed such that each of the pad portions 11b1 to 11b4 and the corresponding feed line 22 face each other via a gap in a plan view, and that the feed lines 22 are located below the pad portions 11b1 to 11b4. More specifically, the pad portions 11b1 to 11b4 are formed on the insulating layer 23, and the feed lines 22 are formed on the mother substrate 21 such that each of the pad portions 11b1 to 11b4 and the corresponding feed line 22 face each other via a gap in a plan view.

Each of facing portions 22a of the feed lines 22 facing the pad portions 11b1 to 11b4 preferably has a horseshoe shape (C-shape) to surround a portion of the corresponding one of the pad portions 11b1 to 11b4. Each of the pad portions 11b1 to 11b4 provided in a circular or substantially circular shape and the corresponding facing portion 22a are concentric.

Figure 7:
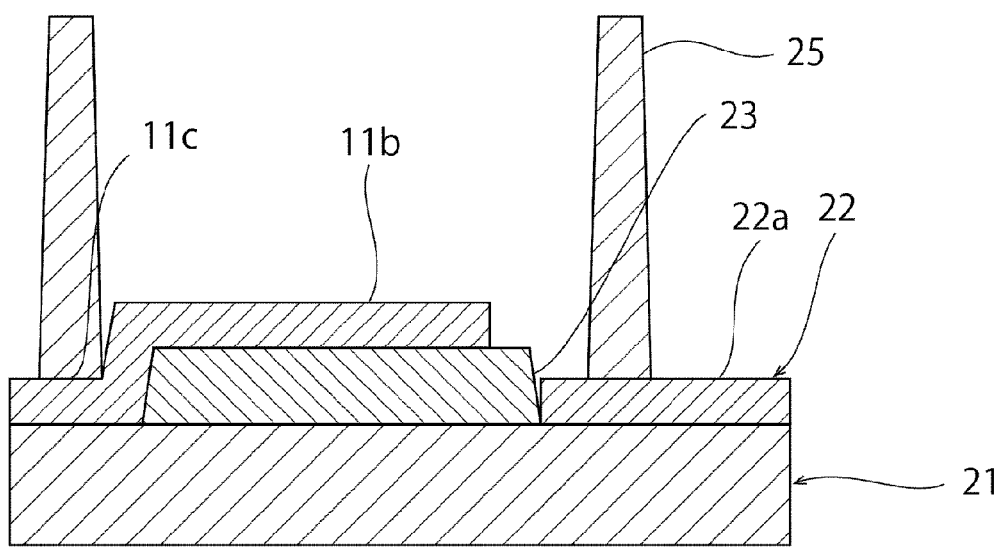
FIG. 7 is a schematic cross-sectional view along a line VII-VII of FIG. 6.

Then, as illustrated in FIG. 7, dividing walls 25 are formed to surround the respective pad portions 11b1 to 11b4. It is possible to form the dividing walls 25 by, for example, forming an insulating film by application or sputtering and patterning the insulating film in accordance with a photolithographic method. The material forming the dividing walls 25 is not particularly limited. The dividing walls 25 may be made of polyimide or epoxy, for example.

Figure 8:
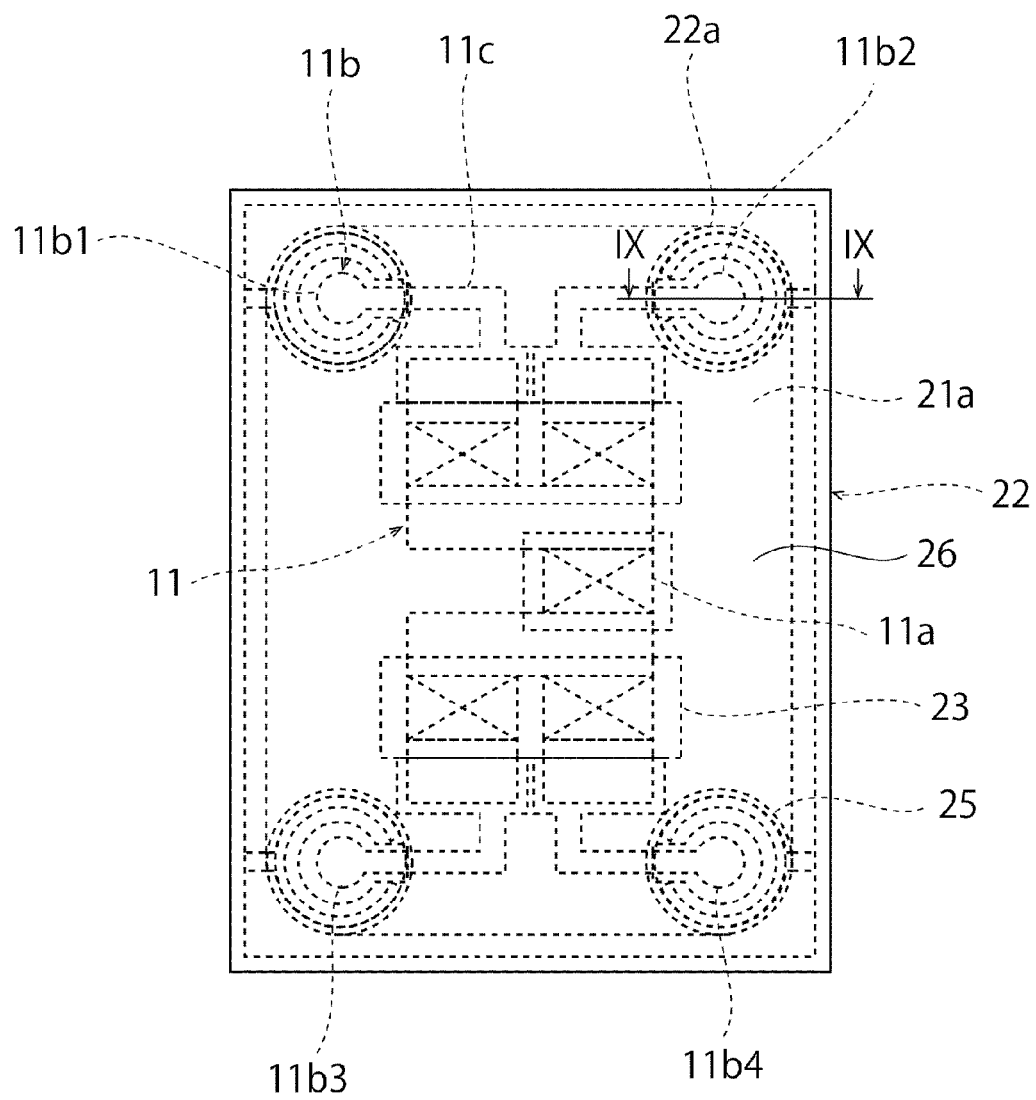
FIG. 8 is a schematic plan view for describing the manufacturing method of an electronic component in the first preferred embodiment of the present invention.
Figure 9:
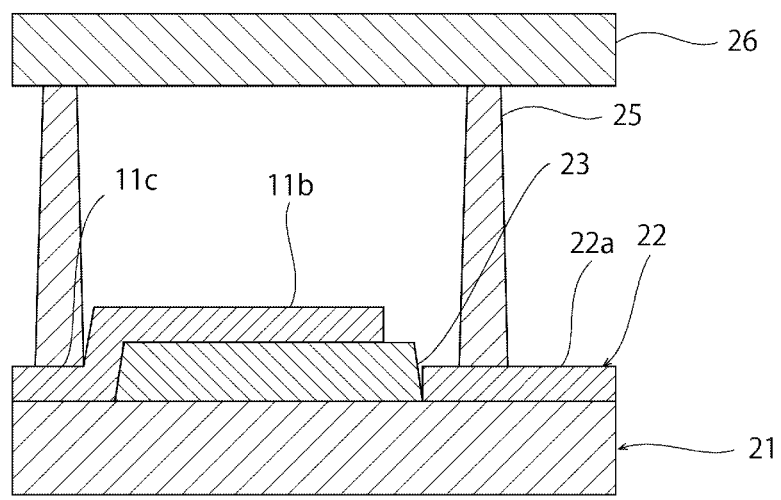
FIG. 9 is a schematic cross-sectional view along a line IX-IX of FIG. 8.
Figure 10:
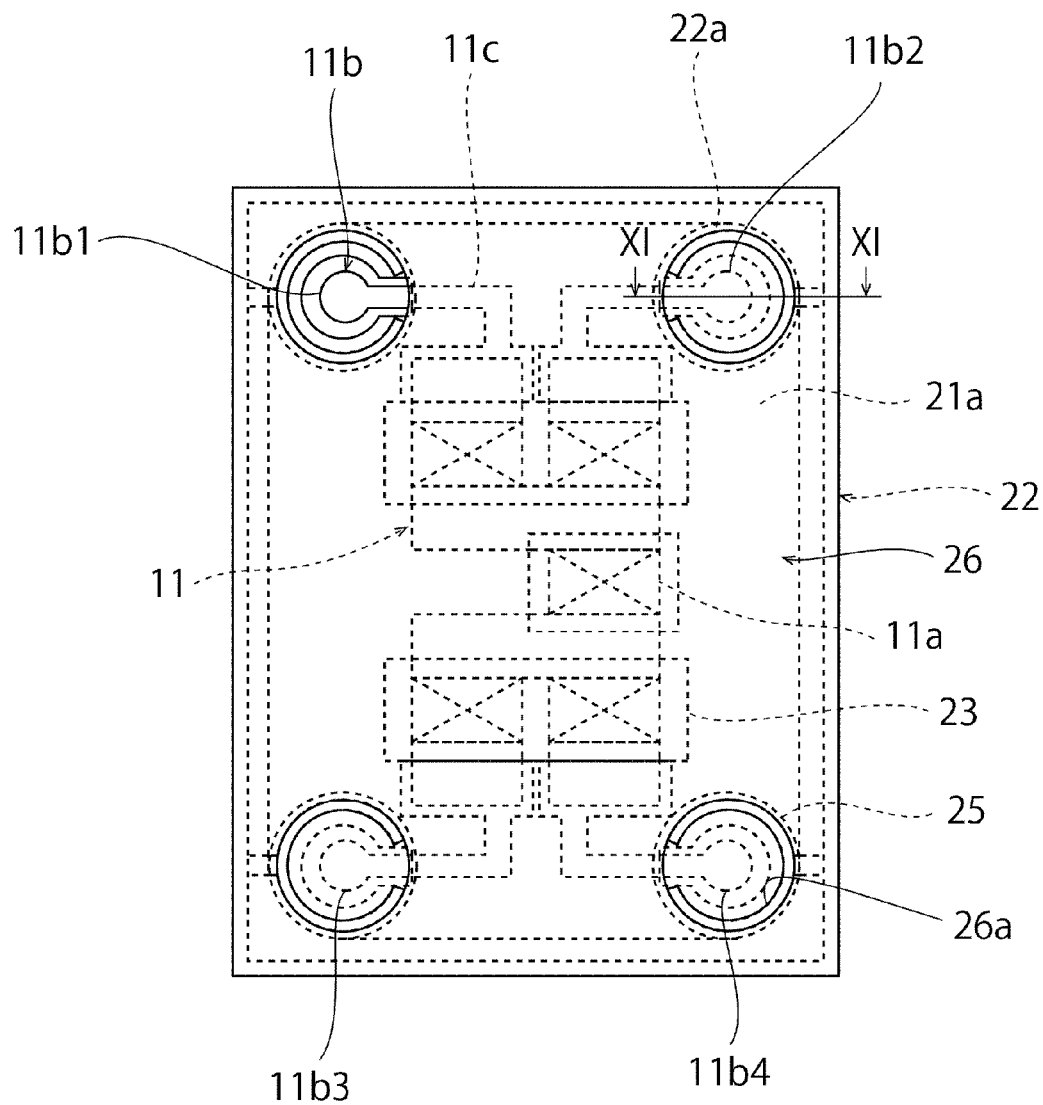
FIG. 10 is a schematic plan view for describing the manufacturing method of an electronic component in the first preferred embodiment of the present invention.
Figure 11:
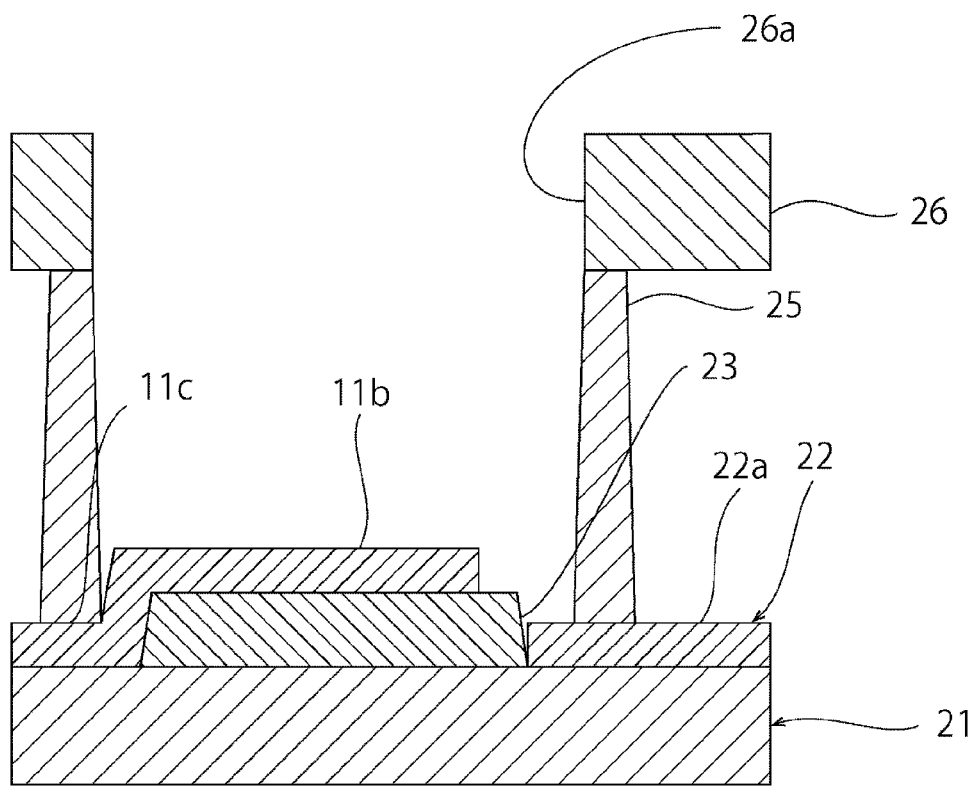
FIG. 11 is a schematic cross-sectional view along a line XI-XI of FIG. 10.
Figure 12:
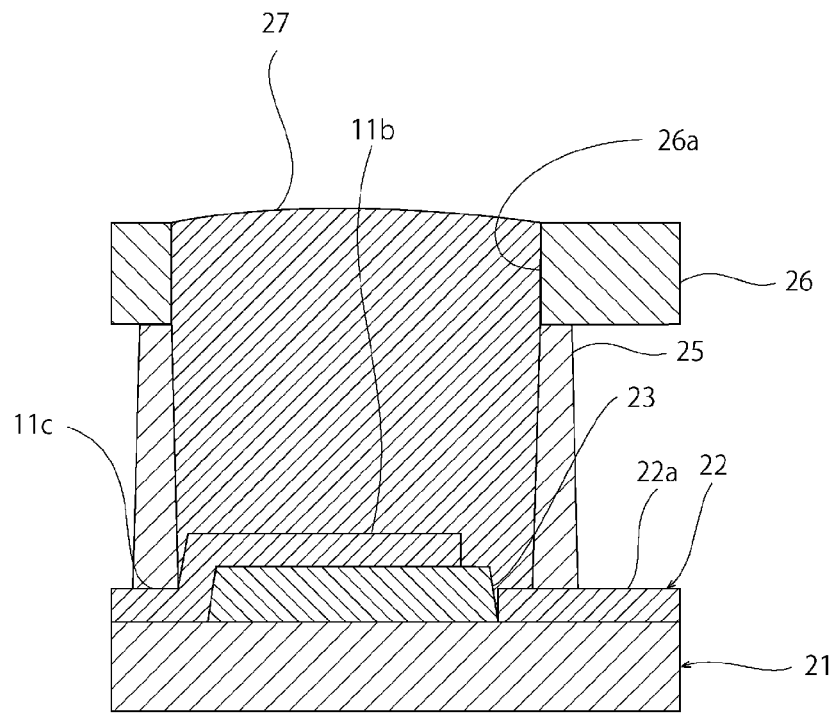
FIG. 12 is a schematic cross-sectional view for describing the manufacturing method of an electronic component in the first preferred embodiment of the present invention.

Then, as illustrated in FIGS. 8 and 9, a cover plate 26 is disposed on the dividing walls 25 to cover or substantially cover the entirety of the mother substrate 21. As illustrated in FIGS. 10 and 11, openings 26a are then formed in the cover plate 26. As a result, the pad portions 11b and portions of the feed lines 22 surrounded by the dividing walls 25 are exposed.

Then, electrolytic plating is performed while power is supplied to the feed lines 22. At the initial stage of the plating process, a plating film grows only on the portions of the feed lines 22 exposed from the cover plate 26. The plating film grows upward and in a planar direction. Herein, in the present preferred embodiment, each of the pad portions 11b1 to 11b4 faces the corresponding feed line 22 via a gap in a plan view, and the feed lines 22 are located below the pad portions 11b1 to 11b4. Therefore, the grown plating film comes into contact with the pad portions 11b1 to 11b4. As a result, the pad portions 11b1 to 11b4 are also supplied with power. Accordingly, a plating film that electrically connects the feed lines 22 and the pad portions 11b1 to 11b4 is formed on the portions of the feed lines 22 exposed from the cover plate 26 and on the pad portions 11b1 to 11b4. The plating film 27 forms an under-bump metal.

The mother substrate 21 is then singulated into a plurality of electronic components 1. The singulation of the mother substrate 21 may be performed by dicing, for example.

In the singulation process, it is preferable to remove at least portions of the feed lines 22 to prevent the pad portions 11b1 to 11b4 from being electrically connected by the feed lines 22.

If the under-bump metal is formed by a plating film, as in the present preferred embodiment, it is necessary to supply power to pad portions. In general, therefore, a plurality of pad portions are electrically connected by feed lines and supplied with power via the feed lines.

In this case, however, the plurality of pad portions are electrically connected by the feed lines. Therefore, it is not possible to inspect functional electrode portions by bringing a probe into contact with the pad portions.

Meanwhile, in the present preferred embodiment, the feed lines 22 and the pad portions 11b1 to 11b4 are electrically connected in the plating process, but are not connected prior to the plating process. Accordingly, it is possible to perform an inspection process of inspecting the functional electrode portions 11a by bringing a probe into contact with the pad portions 11b1 to 11b4. In the inspection process, it is possible to inspect a variety of characteristics, such as frequency characteristics and electrical characteristics, for example. With this inspection process, it is possible to significantly reduce or prevent the supply of defective products to a post-process and improve the non-defect ratio of the electronic components 1.

Further, in the present preferred embodiment, the feed lines 22 are formed preferably after the formation of the functional electrode portions 11a. It is therefore possible to inspect the functional electrode portions 11a before the formation of the feed lines 22. Accordingly, it is possible to remove the influence of capacitance generated between the feed lines 22 and the functional electrode portions 11a on the inspection. Consequently, a highly accurate inspection is possible. In the present invention, however, the feed lines and the element electrodes may be formed by the same process and at the same time. By so doing, it is possible to simplify the manufacturing process of the electronic component.

Another example of a preferred embodiment of the present invention will be described below. In the following description, members substantially common in function to those of the above-described first preferred embodiment will be designated by common reference signs, and description thereof will be omitted.

Second Preferred Embodiment

In the first preferred embodiment, a description has been given of an example in which the pad portions 11b1 to 11b4 are preferably formed on the insulating layer 23 to be located above the feed lines 22. The present invention, however, is not limited thereto.

Figure 16:
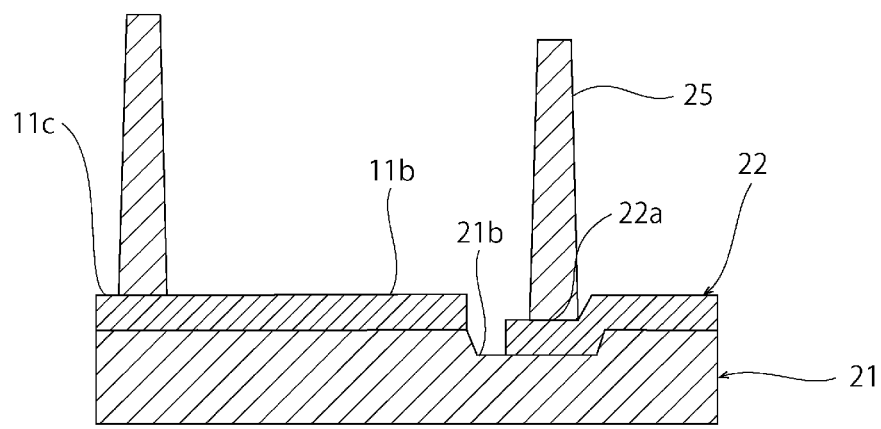
FIG. 16 is a schematic cross-sectional view for describing a manufacturing method of an electronic component in a second preferred embodiment of the present invention.

For example, as illustrated in FIG. 16, concave portions 21b may be formed in the mother substrate 21, and the facing portions 22a of the feed lines 22 may be formed on the concave portions 21b, to make the pad portions 11b1 to 11b4 located above the feed lines 22.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A manufacturing method of an electronic component including a substrate and an element electrode provided on the substrate, the element electrode including functional electrode portions and pad portions connected to the functional electrode portions, the method comprising:
    forming a plurality of the element electrodes and feed lines on a mother substrate for forming the substrate such that each of the pad portions of the plurality of element electrodes and the corresponding one of the feed lines are not electrically connected to one another, each of the pad portions of the plurality of element electrodes and a portion of the corresponding one of the feed lines face each other with a gap therebetween when viewed in a plan view such that each of the portions of the feed lines surrounds a respective one of the pad portions, and a top surface of the feed lines is disposed lower than a top surface of the pad portions when viewed in a cross sectional view;
    performing electrolytic plating while supplying power to the feed lines, to form a plating film that electrically connects the feed lines and the pad portions; and
    singulating the mother substrate to obtain the electronic component.

2. The method according to claim 1, further comprising inspecting the functional electrode portions by bringing a probe into contact with the pad portions prior to the step of performing electrolytic plating.

3. The method according to claim 1, further comprising forming an insulating layer on the mother substrate, wherein at least portions of the pad portions are formed on the insulating layer in the step of forming a plurality of the element electrodes and feed lines.

4. The method according to claim 3, wherein the insulating layer is thicker than the feed lines.

5. The method according to claim 1, further comprising forming concave portions in the mother substrate, wherein portions of the feed lines directly adjacent to the pad portions are formed on the concave portions in the step of forming a plurality of the element electrodes and feed lines.

6. The method according to claim 5, wherein each of the portions of the feed lines facing the pad portions has a horseshoe shape.

7. The method according to claim 5, wherein each of the portions of the feed lines facing the pad portions has a circular or substantially circular shape and is concentric with the corresponding one of the pad portions.

8. The method according to claim 1, wherein the element electrodes and the feed lines are formed by the same process in the step of forming a plurality of the element electrodes and feed lines.

9. The method according to claim 1, wherein the feed lines are formed after the formation of at least the functional electrode portions of the element electrodes in the step of forming a plurality of the element electrodes and feed lines.

10. The method according to claim 1, wherein the substrate is a piezoelectric substrate, the functional electrode portions include interdigital transducer electrodes, and the electronic component is an elastic wave component.

11. The method according to claim 1, wherein at least portions of the feed lines are removed in the step of singulating to prevent the pad portions from being electrically connected by the feed lines.

12. The method according to claim 1, further comprising providing an under-bump metal on each of the pad portions.

13. The method according to claim 1, wherein the electronic component is one of a surface acoustic wave component, a bulk elastic wave component, and a boundary acoustic wave component.

14. The method according to claim 1, further comprising forming dividing walls so as to surround the pad portions.

15. The method according to claim 1, wherein the step of singulating includes dicing the mother substrate to obtain the electronic component.

16. The method according to claim 1, wherein the feed lines and the pad portions are not electrically connected prior to the step of performing electrolytic plating.

* * * * *